United States Patent [19]

Boudewijns

[11] Patent Number: 4,654,682
[45] Date of Patent: Mar. 31, 1987

[54] ANTIBLOOMING IMAGE SENSOR DEVICE

[75] Inventor: Arnoldus J. J. Boudewijns, Eindhoven, Netherlands

[73] Assignee: U.S. Philips Corporation, New York, N.Y.

[21] Appl. No.: 671,154

[22] Filed: Nov. 13, 1984

[30] Foreign Application Priority Data

Nov. 24, 1983 [NL] Netherlands .......................... 8304035

[51] Int. Cl.⁴ ..................... H01L 29/78; H01L 27/14; H01L 27/04
[52] U.S. Cl. ....................................... 357/24; 357/30; 357/48
[58] Field of Search ................. 357/24, 24 LR, 24 M, 357/30, 48

[56] References Cited

U.S. PATENT DOCUMENTS 4,450,464  3/1984  Yamada .......................... 357/24 LR

FOREIGN PATENT DOCUMENTS 2054961  2/1981  United Kingdom .

Primary Examiner—William D. Larkins
Assistant Examiner—Robert P. Limanek
Attorney, Agent, or Firm—Marc D. Schechter

[57] ABSTRACT

An image sensor device comprising a semiconductor substrate having a number of surface-adjoining channel regions. The channel regions are separated from each other by surface-adjoining channel separation zones. The channel regions further adjoin an underlying semiconductor zone extending substantially parallel to the surface. The channel regions have doping concentrations which exceed that of the semiconductor zone. The semiconductor zone has a dopant concentration which exceeds the dopant concentration of the semiconductor substrate. The semiconductor zone has a varying thickness which has minima at the areas of the centers of the channel regions. In such an image sensor device, a potential distribution can be obtained which strongly suppresses blooming. The invention also relates to a method of manufacturing this image sensor device.

6 Claims, 7 Drawing Figures

ANTIBLOOMING IMAGE SENSOR DEVICE

BACKGROUND OF THE INVENTION

The invention relates to an image sensor device. The image sensor device comprises a semiconductor substrate of a first conductivity type having a surface. A number of channel regions of the first conductivity type are formed at the surface of the substrate. The channels extend along the surface transverse to a system of electrodes present on the surface. During operation of the image sensor device, charge is collected and transported in the channel regions. The channel regions therefore are separated from each other by channel separation zones of a second conductivity type opposite to the first conductivity type. The channel separation zones are also formed at the substrate surface. Beneath the channel regions is a semiconductor zone of the second conductivity type extending substantially parallel to the substrate surface.

In such an image sensor device, during operation voltages are applied to the electrodes to form a pattern of potential wells separated by potential barriers in the channel regions. For a given integration time, charge produced in the semiconductor material by incident radiation is collected in these potential wells. Thus, a charge image corresponding to a radiation image is formed. After the integration time, clock voltages are applied to the electrodes to transport the charge packets through the channel regions to a storage register. Such a method is called frame transfer or field transfer. Subsequently, the charge is further processed during the next integration period to produce a television signal.

By the application of suitable voltages between the electrodes, the semiconductor zone and the substrate, a potential barrier can be produced in the semiconductor zone. Thus, charge which, viewed from the surface, is produced above this potential barrier in the semiconductor material will contribute to the formation of the charge image. Charge produced beneath this potential barrier will not contribute to the formation of the charge image. Since long wavelength radiation can penetrate more deeply into the semiconductor material than short wavelength radiation, the spectral sensitivity of the image sensor device is determined by the position of the potential barrier.

British Patent Application No. 2,054,961 discloses an image sensor device in which the semiconductor zone and the channel regions have doping concentrations which do not exceed that of the substrate. As a result, charge collected in the channel regions can influence the potential variation between the surface and the semiconductor substate so that the potential barrier, which was initially present at the area of the semiconductor zone, disappears when a given quantity of charge is exceeded during the integration period. When during the integration period, high intensity irradiation produces excessive charge, the excess charge can flow away to the semiconductor substrate. Thus, this excess charge will not be spread over a large number of adjacent potential wells present in the channel regions during the integration period. This spreading of charge, often designated as "blooming", can give rise to very disturbing lines in a television picture which is formed from signals produced with such an image sensor device.

The known image sensor device comprises a semiconductor substrate on which two semiconductor layers are disposed. The upper layer comprises the channel regions. Both layers have doping concentrations which do not exceed that of the semiconductor substrate. Such a construction cannot be obtained by diffusion of impurities in semiconductor materials. To form layers by diffusion of impurities into a semiconductor body of one conductivity type, a zone of the other conductivity type can be formed only by providing a dopant concentration which exceeds that of the semiconductor body. In order to be able to manufacture the known image sensor device, first a layer of the second conductivity type and then a layer of the first conductivity type will have to be grown epitaxially onto a semiconductor substrate. In this multilayer structure, channel separation zones extending into the lower of the two layers can be formed by means of diffusion of impurities in both layers.

Another disadvantage of the known image sensor device is that the channel regions have widths which are determined during the manufacture of the channel separation zones. The separation zones will have minimum widths which are equal to the minimum dimensions of the windows required for the diffusion, plus two times the distance over which lateral diffusion takes place. This diffusion distance is larger in the known image sensor device than the thickness of the layer in which the channel regions are formed. Starting from a desired center-to-center distance between adjacent channel regions, the desired center-to-center distance minus the width of the required diffusion window and well over twice the thickness of the channel regions is then left for the width of the channel regions. In practice, the desired center-to-center distance is, for example, 10 $\mu$m, the width of the window is 4 $\mu$m and the thickness of the channel regions is 1 $\mu$m. The width of the channel regions is then only about 3 $\mu$m.

The known image sensor device consequently has comparatively narrow channel regions and comparatively wide channel separation zones. This is undesirable because the quantity of charge that can be collected and transported per unit surface area is comparatively small, and also the image sensor device consequently has a comparatively low sensitivity. Charge produced in the channel separation zones flows away to the semiconductor substrate and does not contribute to the formation of the television signal.

SUMMARY OF THE INVENTION

It is an object of the invention to provide an image sensor device in which charge collected in the channel regions can influence the potential variation between the surface and the semiconductor substrate in such a manner that excess charge can flow away to the semiconductor substrate.

It is another object of the invention to provide an image sensor device which has comparatively wide channel regions and comparatively narrow channel separation zones.

In the image sensor device according to the invention, the channel regions have dopant concentrations which exceed that of the semiconductor zone. The dopant concentration of the semiconductor zone, in turn, exceeds the dopant concentration of the semiconductor substrate. The semiconductor zone has a thickness which varies in a direction perpendicular to the channel regions. The thickness of the semiconductor zone has minima at the centers of the channel regions.

The image sensor device according to the invention can be manufactured in a simple manner by diffusing impurities into a semiconductor substrate of the first conductivity type. Zones of the second conductivity type can be provided by diffusing impurities through a first mask with windows at fixed relative center-to-center distances. Zones of the first conductivity type forming the channel regions can be provided by diffusing impurities through a second mask with windows at the same relative center-to-center distances.

The second mask is then arranged so that the channel regions are formed halfway between the zones of the second conductivity type. The channel regions thus formed are then separated by surface-adjoining zones of the second conductivity type (the channel separation zones). The channel regions further adjoin a zone of the second conductivity type extending substantially parallel to the surface. This zone has a thickness, which varies in a direction perpendicular to the channel regions and has minima at the centers of the channel regions.

The channel regions have dopant concentrations which exceed that of the underlying semiconductor zone, while the latter in turn has a dopant concentration which exceeds that of the semiconductor substrate. As a result, effective blooming suppression is possible.

In the image sensor device according to the invention, the widths of the channel regions are equal to the widths of the windows in the second mask plus the distance over which lateral diffusion takes place. This distance is substantially equal to the thickness of the channel regions. In this case, a limiting factor is the minimum separation which has to be maintained between two windows. With a desired center-to-center distance between the channel regions, the maximum widths of these channel regions are equal to this center-to-center distance minus the minimum window separation and plus twice the thickness of the channel regions. In a practical embodiment, the center-to-center distance is 10 $\mu$m, the minimum window width is 4 $\mu$m and the thickness of the channel regions is 1 $\mu$m. The widths of the channel regions are then at least 8 $\mu$m. As compared with the known image sensor device, the image sensor device according to the invention has comparatively wide channel regions and comparatively narrow channel separation zones.

The invention further relates to a method of manufacturing an image sensor device. In this method, zones of the second conductivity type are provided in a semiconductor substrate of the first conductivity type by diffusing impurities through a first mask with windows at fixed relative center-to-center distances. Zones of the first conductivity type forming the channel regions are provided through a second mask with windows at the same relative center-to-center distances. The second mask is arranged so that the channel regions are formed halfway between the zones of the second conductivity type.

Thus, by simple diffusion techniques, an image sensor device is obtained in which the channel regions are separated by surface-adjoining semiconductor zones of the second conductivity type (channel separation zones). The channel regions further adjoin an underlying semiconductor zone of the second conductivity type. The channel regions have dopant concentrations which exceed that of the semiconductor zone, which in turn has a dopant concentration which exceeds that of the semiconductor substrate. The semiconductor zone has a thickness which varies in a direction perpendicular to the channel regions. The thickness has minima at the centers of the channel regions. The image sensor thus formed can be used in a manner such that blooming is strongly suppressed.

DESCRIPTION OF THE PREFERRED EMBODIMENTS

Figure 1:
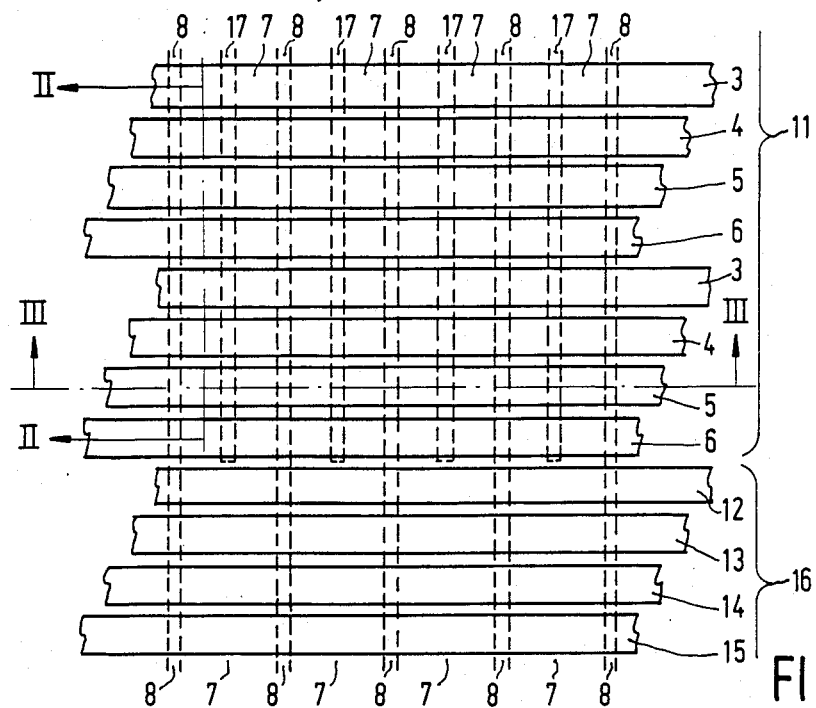
FIG. 1 is a plan view of an embodiment of the image sensor device according to the invention.

The Figures are all schematic and are not drawn to scale. For the sake of clarity, the dimensions in the direction of the thickness of the device are greatly exaggerated in comparison to the other dimensions. Semiconductor zones of the same conductivity type are cross-hatched in the same direction. Corresponding parts are generally denoted by the same reference numerals.

Figure 2:
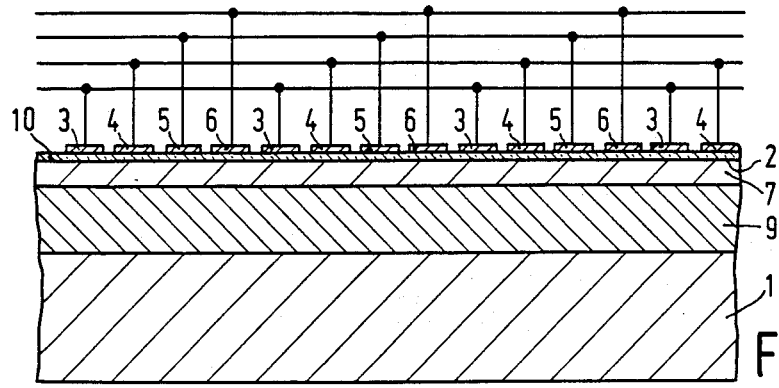
FIG. 2 is a sectional view of the image sensor device of FIG. 1 taking on the line II—II.
Figure 3:
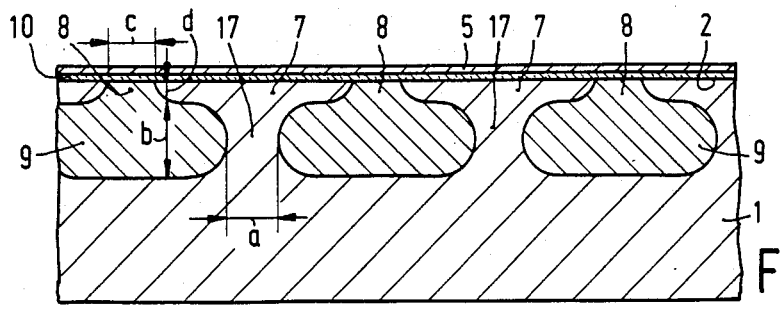
FIG. 3 is a sectional view of the image sensor device of FIG. 1 taking on the line III—III.

FIGS. 1 to 3 show an image sensor device comprising a semiconductor substrate core region 1 of a first conductivity type. In the example, the substrate is n-type silicon. A surface 2 of the substrate is adjoined by a number of channel regions 7 of the first conductivity type. Channel regions 7 extend perpendicular to a system of electrodes 3, 4, 5 and 6 present on the surface 2. During the operation of the device, charge is collected and transported in channel regions 7.

Channel regions 7 are separated by channel separation zones 8 of the second conductivity type opposite to the first conductivity type. Separation zones 8 adjoin the surface 2 and further adjoin an intermediate semiconductor zone 9 of the second conductivity type extending substantially parallel to the surface 2. The electrodes 3, 4, 5 and 6 are insulated from the surface 2 by an insulating layer 10 of, for example, silicon oxide.

During operation, as will be described hereinafter, voltages are applied to the electrodes 3, 4, 5 and 6 to produce a pattern of potential wells separated by potential barriers in the channel regions 7. In these potential wells formed beneath the electrodes 4, 5 and 6, for example, charge produced in the semiconductor materials 7 and 9 by incident radiation is collected for a given integration time. Thus, in a first part 11 of the image sensor device a charge image is formed which corresponds to the radiation image.

After the integration time, clock pulses are applied to the electrodes 3, 4, 5 and 6 and to electrodes 12, 13, 14 and 15. As a result, the charge packets are transported through the channel regions 7 and are transferred, for example, to a storage register 16. The charge can then be read from this register 16 during the next integration time for further signal processing. The storage register 16 is covered by a reflecting aluminum layer not shown so that the charge in this register cannot be modified by incident radiation.

During operation, voltages are applied between the electrodes 3, 4, 5 and 6 and the substrate 1 to form a potential barrier at the area of the semiconductor zone 9. Charge produced above this potential barrier will contribute to the formation of the charge image. Charge produced beneath this potential barrier will not contribute to the formation of this charge image. Since long wavelength radiation can penetrate more deeply into the semiconductor material than short wavelength radiation, the spectral sensitivity of the image sensor device can be varied by varying the position of the potential barrier.

According to the invention, in the image sensor device of FIGS. 1, 2 and 3, the channel regions 7 have dopant concentrations which exceed that of the semiconductor zone 9, which in turn exceeds that of the substrate 1. In the example, the dopant concentration of the n-type channel regions 7 is about $10^{16}$ atoms/cm$^3$, the dopant concentration of the p-type semiconductor zone 9 is about $3.10^{15}$ atoms/cm$^3$ and the dopant concentration of the n-type substrate 1 is about $5.10^{14}$ atoms/cm$^3$. The semiconductor zone 9 further has a thickness which varies in a direction perpendicular to the channel regions 7, with minima at the centers of the channel regions 7. Due to these measures, the electric potential in the image sensor device will vary in a direction perpendicular to the surface 2 as shown in FIG. 4.

Figure 4:
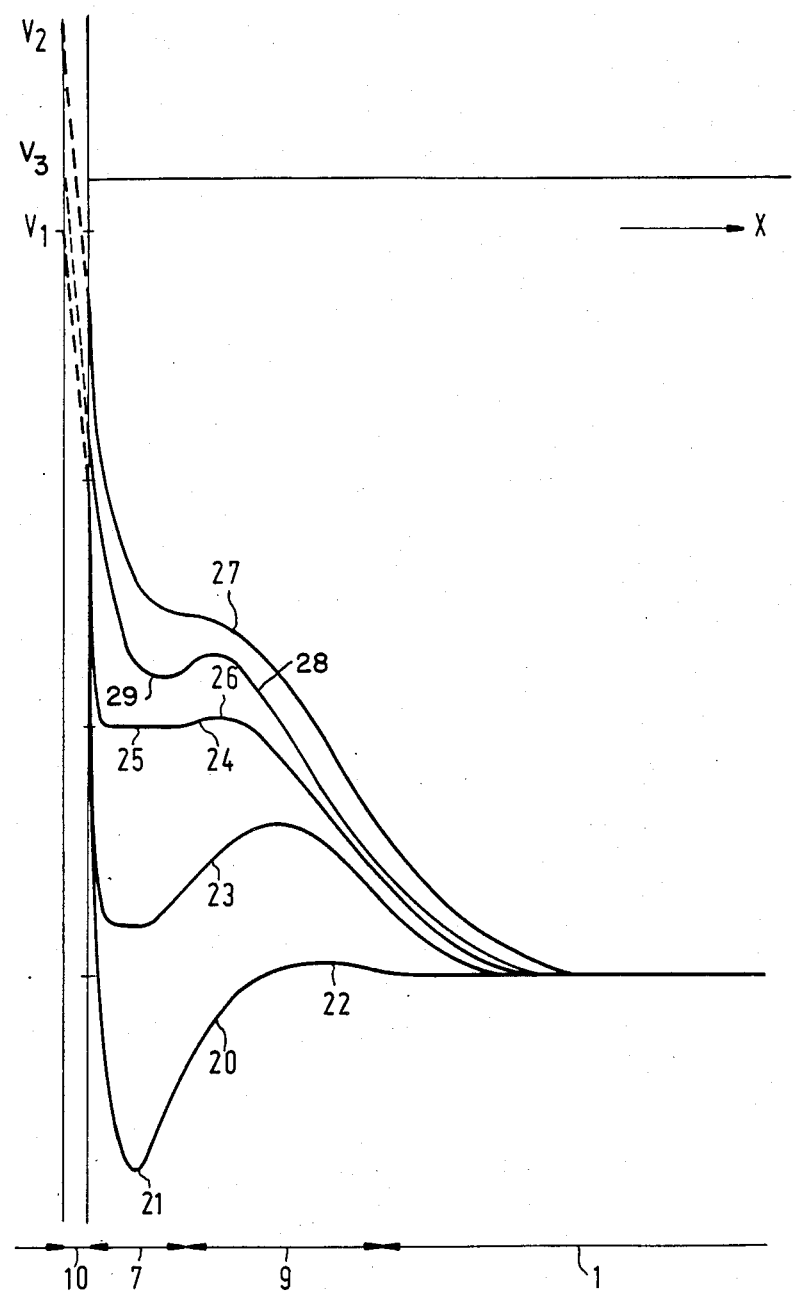
FIG. 4 is a graph of the electrical potential in the image sensor device according to the invention versus the depth, X, in the device.

In FIG. 4, the potential V, at the center of each channel region 7, is indicated as a function of the distance X from the surface 2. The semiconductor zone 9 is at ground potential and the semiconductor substrate 1 is connected to a voltage of about $-15$ V. The curve 20 of FIG. 4 represents the potential variation at the beginning of an integration period. A potential well 21 is located in the channel region 7 and a potential barrier 22 is located at the depth of the semiconductor zone 9.

During the integration period, the potential in the device can vary as shown in curves 23 and 24 due to the collection of negative charge in the channel region 7. When the situation indicated by the curve 24 is reached, only a small potential barrier 26 remains between the potential well 25 in the channel region 7 and the substrate 1. When a further quantity of charge is produced at this area, this charge can flow over the small barrier 26 to the substrate 1.

Potential wells can be formed in the longitudinal direction of the channel regions 7 by applying to the electrodes 3, for example, a voltage $V_2$ and by applying to the electrodes 4, 5 and 6 a voltage $V_1$. Beneath the electrodes 4, 5 and 6 the potential variations 20, 23, and 24, respectively, are than obtained. Beneath the electrode 3, the potential variation 27 is obtained. (In FIG. 4, the voltage drop across the insulating layer 10 is indicated by dotted lines). Thus, any excess charge in a potential well will flow away to the substrate 1 instead of to adjacent potential wells in the channel region 7. This latter phenomenon, which is often designated as "blooming", can give rise to very disturbing lines in a television picture if it is not avoided.

The "anti-blooming" described can be obtained with very practical voltages between the electrodes 3, 4, 5 and 6 and the substrate if, according to a preferred embodiment of the invention, the semiconductor zone 9 is interrupted at the centers of the channel regions 7 and exhibits slots 17 at this area where the n+ channel regions 7 extend through substrate core region 1. (FIG. 3.)

As described below, the image sensor device can be manufactured in a simple manner to produce channel regions 7 which are wider than channel separation zones 8. The image sensor device according to the invention thus has a comparatively high sensitivity.

Figure 5:
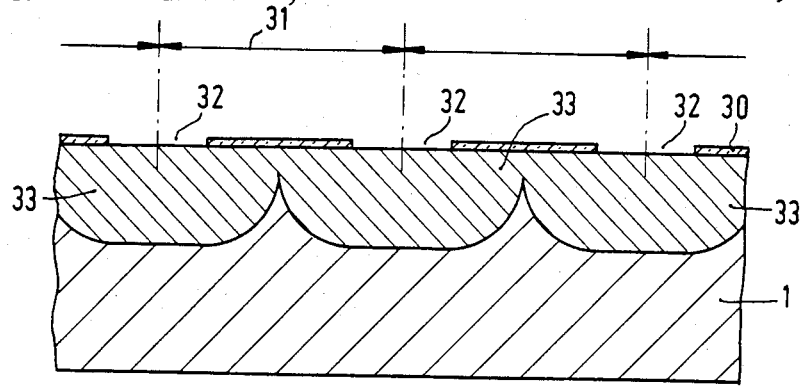
FIGS. 5, 6 and 7 are cross-sectional views of successive stages in the manufacture of the image sensor device shown in FIGS. 1, 2 and 3.
Figure 6:
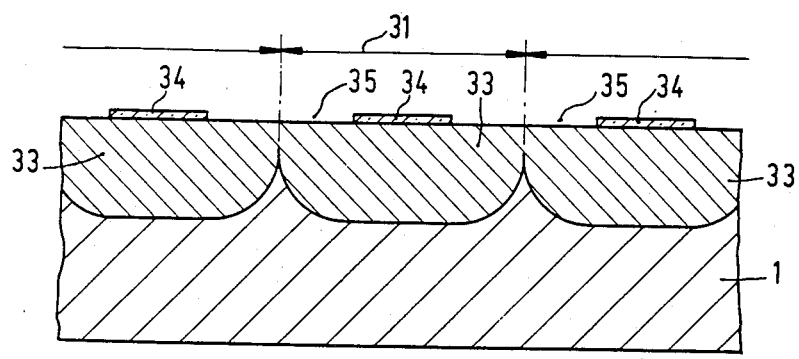
Figure 7:
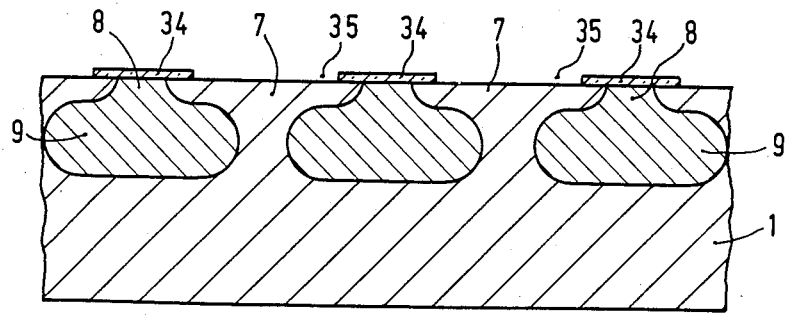

FIGS. 5, 6 and 7 show successive stages in the manufacture of the image sensor device shown in FIGS. 1 to 3. FIG. 5 shows the first stage of manufacture. Semiconductor substrate 1 of the first conductivity type, is in this case n-type silicon having an average dopant concentration of about $5.10^{14}$ atoms/cm$^3$. Zones 33 of the second conductivity type, in this case p-type, are formed by diffusion of impurities into substrate 1. The diffusion is via a mask 30 of, for example, silicon oxide with windows 32 at fixed center-to-center distances 31. These zones 33 have average dopant concentrations of about $3.10^{15}$ atoms/cm$^3$.

Next, as shown in FIG. 6, channel regions 7 of the first conductivity type, in this case n-type, are provided via a second mask 34. Mask 34 is, for example, also made of silicon oxide. Mask 34 has windows 35 at the same relative center-to-center distances 31. By diffusion of impurities through mask 34, the structure shown in FIG. 7 is formed.

The second mask 34 is arranged so that the channel regions 7 are formed halfway between the zones 33. The channel regions 7 are than separated from each other by channel separation zones 8. Channel regions 7 further adjoin the zone 9 extending substantially parallel to the surface 2. This zone 9 has a thickness which varies in a direction perpendicular to the channel regions and has minima at the centers of the channel regions 7.

The channel regions 7 have dopant concentrations, in this embodiment, of about $10^{16}$ atoms/cm$^3$ on an average. These concentrations exceed that of the zone 9, which is about $3.10^{15}$ atoms/cm$^3$ on an average. The dopant concentration of zone 9, in turn, exceeds that of the substrate 1, which is about $5.10^{14}$ atoms/cm$^3$.

The widths of the channel regions 7 are equal to the widths of the windows 35 in the second mask 34 plus the distance over which lateral diffusion of the channel regions 7 occurs. This distance is approximately equal to the depth of the channel regions 7 and amounts, for example, to 1 $\mu$m. A limiting factor is the minimum separation which must be maintained between two adjacent windows 35. If a mask can be made in which this separation is 4 $\mu$m, the widths of the channel regions become about 8 $\mu$m, and the widths of the channel separation zones 8 become about 2 $\mu$m, when the center-to-center distance is 10 $\mu$m.

After an insulating layer 10 and systems of electrodes 3, 4, 5, 6 and 12, 13, 14, 15 have been provided in a usual manner after removal of the mask 34, the structure of FIGS. 1 to 3 is obtained. In FIG. 1, the slot regions 17 in zone 9 do not extend beneath the electrodes 12, 13, 14, 15 of the storage register 16 because there is no danger of blooming here. However, there is no objection against providing slots 17 here too.

Preferably, the slots 17 have widths, a, in a direction perpendicular to the channels 7, which exceed half the thickness, b, of the semiconductor zone 9, measured just beside the channel separation zones 8. (FIG. 3.) In this case, at a substrate voltage of $+15$ V and a voltage at the channel separation zones of 0 V, $V_1$ can be about 0 V and $V_2$ can be about $-5$ V.

In order to collect as much charge generated in the channel separation zones 8 as is possible, the channel separation zones 8 have widths, c, in a direction perpendicular to the channel regions, which are smaller than four times the thicknesses, d, of the channel regions 7, measured just beside the channel separation zones 8. Thus, it is ensured that in a direction perpendicular to the channel regions 7, the potential variation causes charge produced in the channel separation zones 8 to flow to the adjacent channel zones 7 and not to the substrate 1 via the zone 9.

The slots 17 are obtained in a simple manner when the aforementioned two diffusions are performed so that the zones 9 of the second conductivity type do not contact each other, but are separated by regions 7 and 1 of the first conductivity type.

The invention is not limited to the embodiment described above, but many variations are possible without departing from the scope of the invention. For example, the electrode system on the surface 2 may have light windows and may comprise electrodes overlapping each other. Furthermore, the electrode system may be, instead of the 4-phase clock system shown, a 3-phase or 2-phase clock system. In the latter case, and in the case in which the electrode system has light windows, additional semiconductor zones of the second conductivity type may be formed in the channel regions in order to obtain desired potentials in the channel regions.

Furthermore, the potential beneath the electrode 3 can vary as indicated by curve 28 in FIG. 4, by applying a voltage $V_3$ to the electrode 3. Voltage $V_3$ is between $V_1$ and $V_2$. Thus, a potential well 29 is formed. As a result of well 29, the sensitivity of the sensor will be improved since charge generated beneath electrode 3 now will flow to the channel region beneath electrodes 4, 5 and 6 instead of to the substrate 1. (Charge flows to substrate 1 when the potential is as indicated by curve 27.)

What is claimed is:

1. An image sensor device comprising:
   a semiconductor substrate having a top surface;
   a number of channel regions in the substrate, said channel regions adjoining the top surface of the substrate, said channel regions extending in a longitudinal direction parallel to the top surface, said channel regions having a conductivity of a first type;
   a number of channel separation zones in the substrate, said channel separation zones adjoining the top surface of the substrate, said channel separation zones extending in the longitudinal direction parallel to the top surface and separating neighboring channel regions, said channel separation zones having a conductivity of a second type opposite to the first type;
   an intermediate semiconductor zone in the substrate, said intermediate semiconductor zone arranged beneath and adjoining the channel regions and the channel separation zones, said intermediate semiconductor zone extending substantially parallel to the top surface of the substrate, said intermediate semiconductor zone having a conductivity of the second type;
   a core region in the substrate, said core region arranged beneath and adjoining the intermediate semiconductor zone, said core region having a conductivity of the first type; and
   a system of electrodes above the top surface of the substrate, said electrodes extending perpendicular to the longitudinal direction and parallel to the top surface;
   characterized in that:
   the channel regions have center lines and dopant concentrations;
   the intermediate semiconductor zone has a dopant concentration less than the dopant concentrations of the channel regions;
   the core region has a dopant concentration less than the dopant concentration of the intermediate semiconductor zone; and
   the intermediate semiconductor zone has a thickness in a direction perpendicular to the top surface which varies in a direction perpendicular to the longitudinal direction and perpendicular to the thickness direction, said thickness having minima beneath the center lines of the channel regions.

2. An image sensor device as claimed in claim 1, characterized in that the minima in the thickness of the intermediate semiconductor zone are slot regions having conductivity of the first type.

3. An image sensor device as claimed in claim 2, characterized in that the slot regions have widths in a direction perpendicular to the longitudinal direction and parallel to the top surface which exceed one-half the thickness of the intermediate semiconductor zone below the junctions between the channel regions and the channel separation zones.

4. An image sensor device as claimed in claim 3, characterized in that the channel separation zones have widths in a direction perpendicular to the longitudinal direction and parallel to the top surface which are less than four times the thicknesses of the channel regions in a direction perpendicular to the top surface at positions adjoining the channel separation zones.

5. An image sensor device as claimed in claim 2, characterized in that the channel separation zones have widths in a direction perpendicular to the longitudinal direction and parallel to the top surface which are less than four times the thicknesses of the channel regions in a direction perpendicular to the top surface at positions adjoining the channel separation zones.

6. An image sensor device as claimed in claim 1, characterized in that the channel separation zones have widths in a direction perpendicular to the longitudinal direction and parallel to the top surface which are less than four times the thicknesses of the channel regions in a direction perpendicular to the top surface at positions adjoining the channel separation zones.

* * * * *